United States Patent
Aoki et al.

(10) Patent No.: US 7,583,746 B2
(45) Date of Patent: *Sep. 1, 2009

(54) WIRELESS TRANSMITTING AND RECEIVING DEVICE AND METHOD

(75) Inventors: Tsuguhide Aoki, Kawasaki (JP); Daisuke Takeda, Tokyo (JP); Takahiro Kobayashi, Kawasaki (JP); Yasuhiko Tanabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 664 days.

This patent is subject to a terminal disclaimer.

(21) Appl. No.: 11/018,251

(22) Filed: Dec. 22, 2004

(65) Prior Publication Data

US 2005/0163081 A1 Jul. 28, 2005

(30) Foreign Application Priority Data

Dec. 26, 2003 (JP) ............................. 2003-433347
Dec. 9, 2004 (JP) ............................. 2004-357097

(51) Int. Cl.
*H04B 7/02* (2006.01)

(52) U.S. Cl. ........................ 375/267; 375/299; 375/369; 375/347; 375/316; 375/295; 375/260; 375/259; 370/69.1; 370/334; 455/504; 455/132; 455/59

(58) Field of Classification Search ................. 375/267, 375/299, 347, 369, 316, 295, 260, 259; 455/132, 455/504, 59; 370/69.1, 334
See application file for complete search history.

(56) References Cited

U.S. PATENT DOCUMENTS 6,917,311 B2 *  7/2005  Hosur et al. ................... 341/50
7,277,685 B2 * 10/2007  Liu et al. .................. 455/240.1
2004/0005022 A1 *  1/2004  Zhu et al. ..................... 375/365
2005/0141407 A1    6/2005  Sandhu ........................ 370/203
2005/0163081 A1    7/2005  Aoki et al.
2005/0208897 A1 *  9/2005  Lyons et al. ............... 455/67.11
2005/0233709 A1 * 10/2005  Gardner et al. .............. 455/101
2006/0252386 A1   11/2006  Boer et al. ................... 455/101

FOREIGN PATENT DOCUMENTS

JP    2005-73221    3/2005

OTHER PUBLICATIONS

U.S. Appl. No. 11/201,385, filed Aug. 11, 2005, Aoki.
U.S. Appl. No. 11/132,279, filed May 19, 2005, Aoki.
U.S. Appl. No. 11/018,251, filed Dec. 22, 2004, Aoki et al.
U.S. Appl. No. 11/087,601, filed Mar. 24, 2005, Aoki.
U.S. Appl. No. 11/016,808, filed Dec. 21, 2004, Seto et al.
Jan Boer, et al., "Backwards Compatibility", How to make a MIMO-OFDM system backwards compatible and coexistence with 11a/g at the link level, IEEE 802.11-03/714r0, Sep. 2003, Slide 1-26.
U.S. Appl. No. 12/060,647, filed Apr. 01, 2008, Seto et al.

* cited by examiner

*Primary Examiner*—Shuwang Liu
*Assistant Examiner*—Helene Tayong
(74) *Attorney, Agent, or Firm*—Oblon, Spivak, McClelland, Maier & Neustadt, P.C.

(57) ABSTRACT

A wireless device, method, and signal for use in communication of a wireless packet between transmitting device and a wireless receiving device via a plurality of antennas, wherein a signal generator generates wireless packet including a short-preamble sequence used for a first automatic gain control (AGC), a first long-preamble sequence, a signal field used for conveying a length of the wireless packet, an AGC preamble sequence used for a second AGC to be performed after the first AGC, a second long-preamble sequence, and a data field conveying data. The AGC preamble sequence is transmitted in parallel by the plurality of antennas.

41 Claims, 11 Drawing Sheets

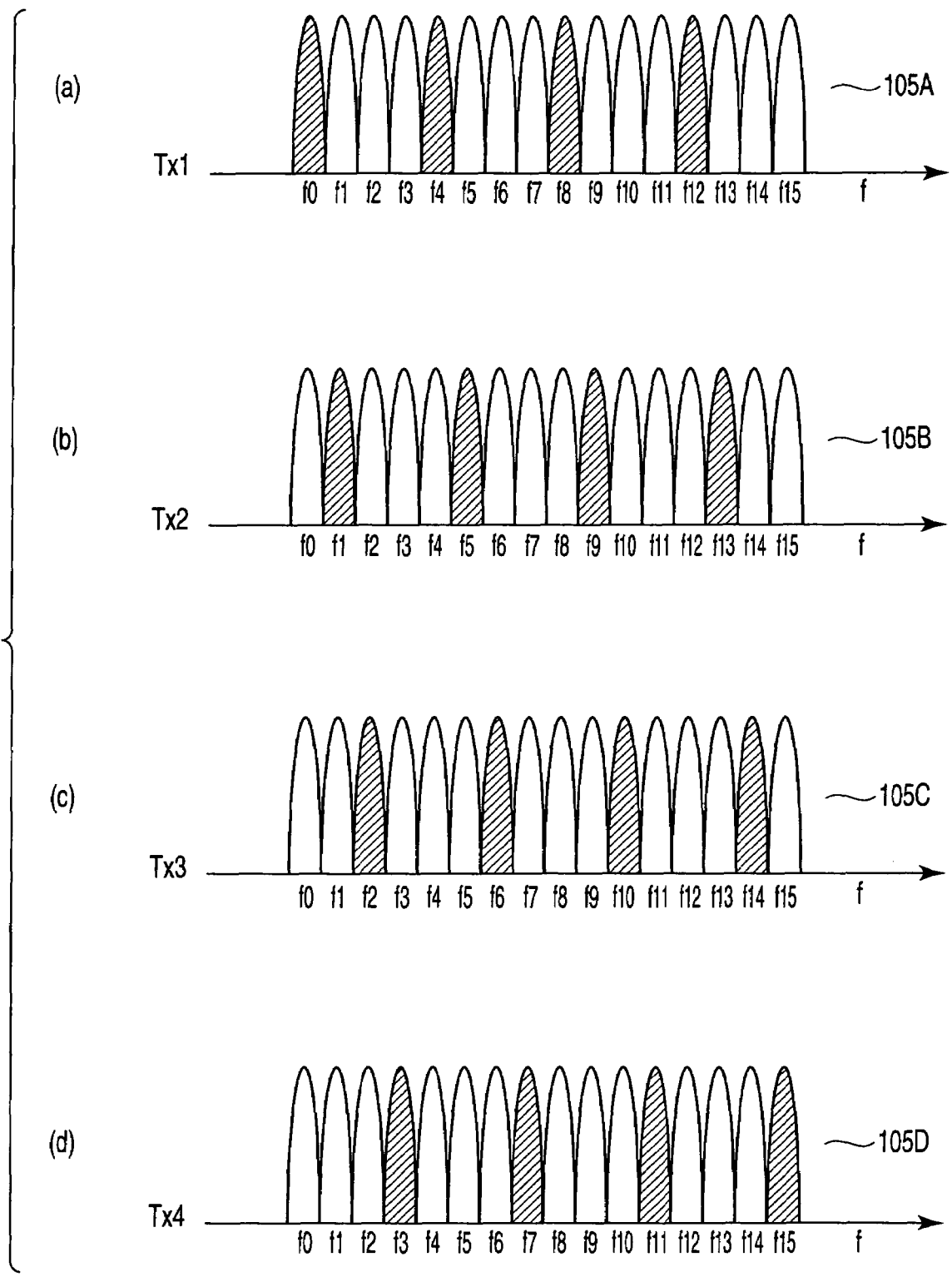
F I G. 13

WIRELESS TRANSMITTING AND RECEIVING DEVICE AND METHOD

CROSS-REFERENCE TO RELATED APPLICATIONS

This application is based upon and claims the benefit of priority from prior Japanese Patent Applications No. 2003-433347, filed Dec. 26, 2003; and No. 2004-357097, filed Dec. 9, 2004, the entire contents of both of which are incorporated herein by reference.

BACKGROUND OF THE INVENTION

1. Field of the Invention

The present invention relates to a wireless transmitting device and wireless receiving device for respectively transmitting and receiving radio signals in mobile communication system like a wireless LAN, using a wireless packet including a preamble and data, and a wireless transmission method and wireless receiving method for use in the devices.

2. Description of the Related Art

The Institute of Electrical and Electronics Engineers (IEEE) is now defining a wireless LAN standard called IEEE 802.11n, which aims to achieve a high throughput of 100 Mbps or more. It is very possible that IEEE 802.11n will employ a technique, called multi-input multi-output (MIMO), for using a plurality of antennas in a transmitter and receiver. IEEE 802.11n is required to coexist with the standard IEEE 802.11a where OFDM (Orthogonal Frequency Division Multiplex) is used. So, it is required that IEEE 802.11n wireless transmitting device and receiving device have so called backwards compatibility.

A proposal presented by Jan Boer et al. in "Backwards Compatibility", IEEE 802.11-03/714r0, introduces a wireless preamble for MIMO. In this proposal, a short-preamble sequence used for time synchronization, frequency synchronization and automatic gain control (AGC), a long-preamble sequence used to estimate a channel impulse response, a signal field indicating a modulation scheme used in the wireless packet, and another signal field for IEEE 802.11n are firstly transmitted from a single particular transmit antenna. Subsequently, long-preamble sequences are transmitted from the other three transmit antennas. After finishing the transmission of the preamble, transmission data is transmitted from all the antennas.

From the short-preamble to the first signal field, the proposed preamble is identical to the preamble stipulated in IEEE 802.11a where single transmit antenna is assumed. Therefore, when wireless receiving devices that conform to IEEE 802.11a receive a wireless packet containing the Boer's proposed preamble, they recognize that the packet is based on IEEE 802.11a. Thus, the proposed preamble conforming to both IEEE 802.11a and IEEE 802.11n enables IEEE 802.11a and IEEE 802.11n to coexist.

Generally, in wireless receiving devices, demodulation of a received signal is performed by digital signal processing. Therefore, an analog-to-digital (A/D) converter is provided in the devices for digitizing a received analog signal. A/D converters have an input dynamic range (an allowable level range of analog signals to be converted). Accordingly, it is necessary to perform automatic gain control (AGC) for adjusting the levels of received signals within the input dynamic range of the A/D converter.

Since the estimation of a channel impulse response using the above-mentioned long preamble sequences is performed by digital signal processing, AGC must be performed using the signal transmitted before the long-preamble sequence. In the Boer's preamble, AGC is performed using a short-preamble sequence transmitted before the long-preamble sequence from a particular transmit antenna. That is, the receiving level of the short-preamble sequence is measured, and AGC is performed so that the receiving level falls within the input dynamic range of the A/D converter. By virtue of AGC using the short-preamble sequence, the long-preamble sequence and data transmitted from the particular transmit antenna can be received correctly. If all the antennas are arranged apart, the receiving levels of signals transmitted from the antennas are inevitably different from each other. Therefore, when a wireless receiving device receives long-preamble sequences transmitted from the other three transmit antennas, or data transmitted from all the antennas, their receiving levels may be much higher or lower than the level acquired by AGC using the short-preamble sequence transmitted from the particular transmit antenna. When the receiving level exceeds the upper limit of the input dynamic range of the A/D converter, the output of the A/D converter is saturated. On the other hand, when the receiving level is lower than the lower limit of the input dynamic range of the A/D converter, the output of the A/D converter suffers a severe quantization error. In either case, the A/D converter cannot perform appropriate conversion, which adversely influences the processing after A/D conversion.

Further, data is transmitted from all the antennas. Therefore, during data transmission, the range of variations in receiving level is further increased, which worsens the above-mentioned saturation of the A/D converter output and/or the quantization error therein, thereby significantly degrading the receiving performance.

As described above, in the Boer's proposed preamble, AGC is performed at the receive side using only the short-preamble sequence transmitted from a single transmit antenna, which makes it difficult to deal with variations in receiving level that may occur when signals transmitted from the other antennas in MIMO mode are received.

BRIEF SUMMARY OF THE INVENTION

In accordance with an aspect of the invention, there is provided a wireless transmitting device for use in communication with a wireless receiving device with a wireless packet, comprising: a plurality of antennas; and a signal generator generates a signal for the wireless packet being transmitted, the wireless packet comprising: a short-preamble sequence used for a first automatic gain control (AGC); a first long-preamble sequence; a signal field used for conveying information regarding a length of the wireless packet; an AGC preamble sequence used for a second AGC to be performed after the first AGC; a second long-preamble sequence; and a data field conveying data, wherein the AGC preamble sequence being transmitted by the plurality of antennas in parallel.

Since a signal format employed in the invention includes preambles for fine tune the AGC for MIMO reception transmitted from multiple antennas, the input level of an A/D converter can be appropriately adjusted with a short time, thereby enhancing the receiving performance of a wireless receiving device and reducing the number of resolution bits of the A/D converter.

BRIEF DESCRIPTION OF THE SEVERAL VIEWS OF THE DRAWING

The accompanying drawings, which are incorporated in and constitute a part of the specification, illustrate an embodiment of the invention, and together with the general description given above and the detailed description of the embodiment given below, serve to explain the principles of the invention.

FIG. 13 is a view illustrating other structural examples of the AGC preambles appearing in FIG. 1.

DETAILED DESCRIPTION OF THE INVENTION

Embodiments of the invention will be described in detail with reference to the accompanying drawings.

Figure 1:
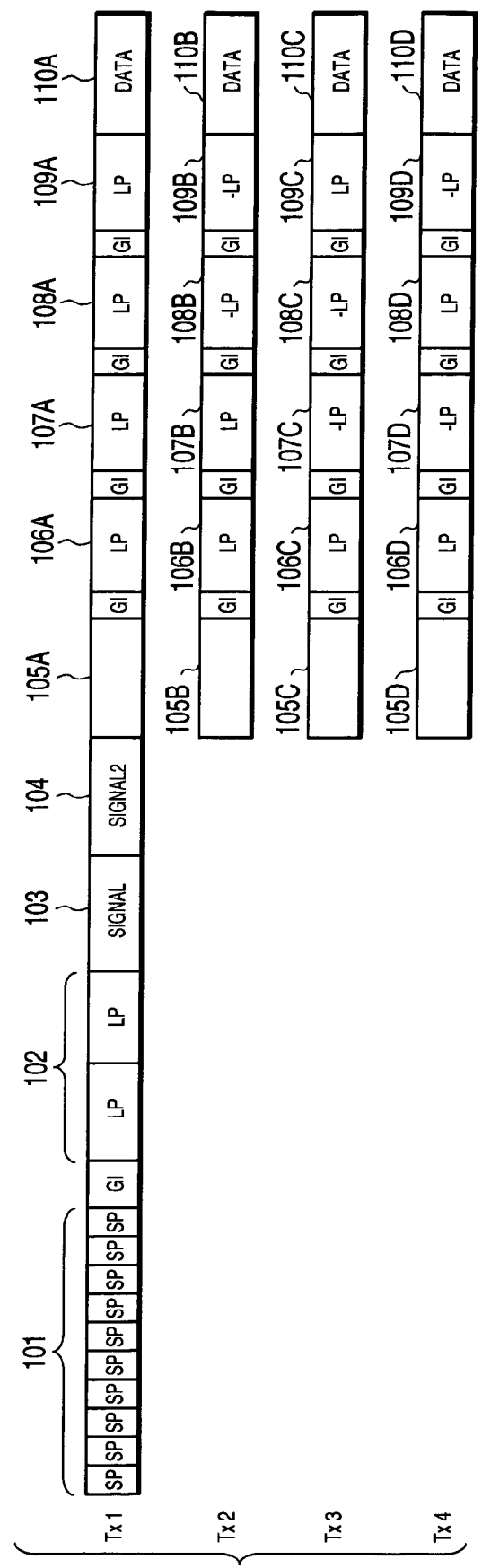
FIG. 1 is a view illustrating a format for a wireless packet including the AGC preambles for wireless communication used in an embodiment of the invention.

FIG. 1 shows a format for a wireless packet employed in a first embodiment of the invention. This format is a physical layer protocol data unit format for the MIMO mode and provides interoperability and coexistence with IEEE802.11a wireless stations.

As seen from FIG. 1, a preamble includes a physical layer convergence protocol (PLCP) signal transmitted from an antenna Tx1. The PLCP signal includes a short-preamble sequence 101, first long-preamble sequence 102, first signal field (SIGNAL) 103 and second signal field (SIGNAL 2) 104. The short-preamble sequence 101 contains several unit preambles SP. The long-preamble sequence 102 contains the unit preambles LP having respective predetermined lengths. The preambles LP are longer than the preambles SP.

The short-preamble sequence 101, first long-preamble sequence 102 and first signal field 103 conform to IEEE 802.11a, while the second signal field 104 is necessary for the new wireless LAN standard IEEE 802.11n. First signal field 103 conforming to IEEE 802.11a may be called "legacy signal field". Since the second signal field 104 is provided for new high throughput wireless LAN standard, it may be called "high throughput signal field". A guard interval GI is inserted between the short-preamble sequence 101 and the long-preamble sequence 102.

After the PLCP signal, AGC preambles 105A to 105D that are transmitted in parallel from a plurality of antennas Tx1 to Tx4 are positioned. The AGC preambles 105A to 105D are transmitted simultaneously from a plurality of antennas Tx1 to Tx4. The AGC preambles 105A to 105D are used to enable the receiving device to perform fine AGC when performing MIMO communication. These preambles are unique to perform fine tune the AGC for reception of MIMO mode in accordance with IEEE802.11n. Therefore, the AGC preambles 105A to 105D may be called "high throughput short trainings field". On the other hand, since the short-preamble sequence 101 conforms to IEEE 802.11a, being used for coarse AGC operation, it may be called "legacy short training field".

After the AGC preambles 105A to 105D, second long-preamble sequences 106A to 109A, 106B to 109B, 106C to 109C and 106D to 109D are positioned. In the embodiment, the same signal sequences are used as the AGC preambles 105A to 105D. However, different signal sequences may be used as the AGC preambles 105A to 105D. A guard interval GI is inserted between each pair of adjacent ones of the unit preambles LP that form the second long-preamble sequences 106A to 109A, 106B to 109B, 106C to 109C and 106D to 109D. As described later, the second long-preamble sequences 106A to 109A, 106B to 109B, 106C to 109C and 106D to 109D are in an orthogonal relationship. The number of unit preambles LP 106-109 for each transmit antenna is equal to the number of transmit antennas in MIMO mode. In order to distinguish between two kinds of long-preamble sequences, first long-preamble sequence 102 conforming to IEEE 802.11a may be called "legacy long training field". Since the second long preambles sequences 106-109 are provided for new high throughput wireless LAN standard, it may be called "high throughput long training field".

After each of the second long-preamble sequences 106A to 109A, 106B to 109B, 106C to 109C and 106D to 109D, a field for transmission data (DATA) 110A to 110C transmitted from the antennas Tx1 to Tx4, respectively, is positioned. The second long-preamble sequences 106A to 109A, 106B to 109B, 106C to 109C and 106D to 109D are transmitted simultaneously from a plurality of antennas Tx1 to Tx4 respectively.

Figure 2:
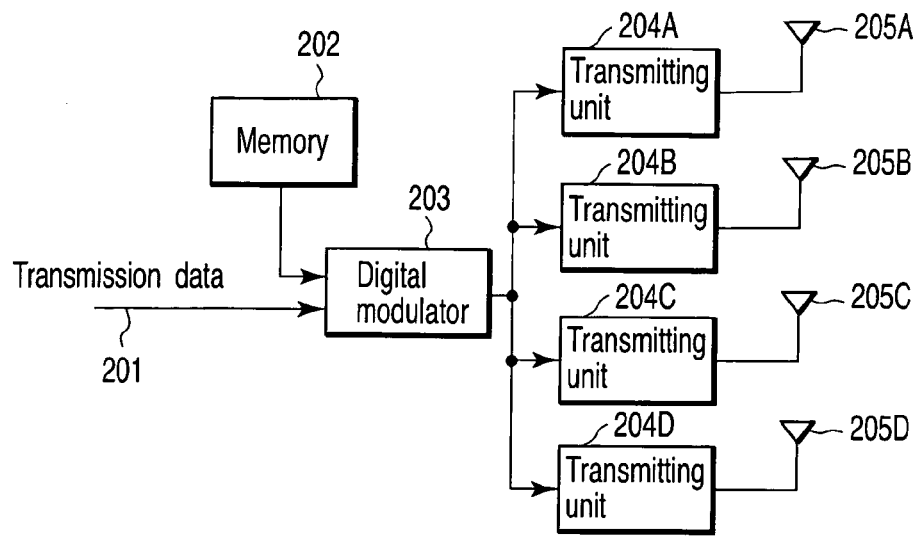
FIG. 2 is a block diagram illustrating the configuration of a wireless transmitting device according to the embodiment.

Referring now to FIG. 2, the wireless transmitting device according to the embodiment will be described. Firstly, digital modulator 203 forms a signal for wireless packet by combining transmission data 201 and the above-described preamble outputted from a memory 202. The thus-obtained signal for wireless packet is sent to transmitting units 204A to 204D, where they are subjected to processing needed for transmission, for example, digital-to-analog (D/A) conversion, frequency conversion into a radio frequency (RF) band (up-conversion) and power amplification. Thereafter, the resultant signal is sent to a plurality of antennas 205A to 205D corresponding to the antennas Tx1 to Tx4 described with reference to FIG. 1, where an RF signal is sent from each transmit antenna 205A to 205D to the wireless receiving device shown in FIG. 3. In the description below, the antennas Tx1 to Tx4 shown in FIG. 1 are referred to as the antennas 205A to 205D, respectively.

In the embodiment, the PLCP signal shown in FIG. 1, which includes the short-preamble sequence 101, first long-preamble sequence 102, first signal field 103 and second signal field 104, is transmitted from the transmit antenna 205A of the transmission unit 204A shown in FIG. 2. The AGC preambles 105A to 105D, second long-preamble sequences 106A to 109A, 106B to 109B, 106C to 109C and 106D to 109D, which are positioned after the PLCP signal as shown in FIG. 1, and the data 110A to 110D are transmitted across all the transmit antennas 205A to 205D.

Figure 3:
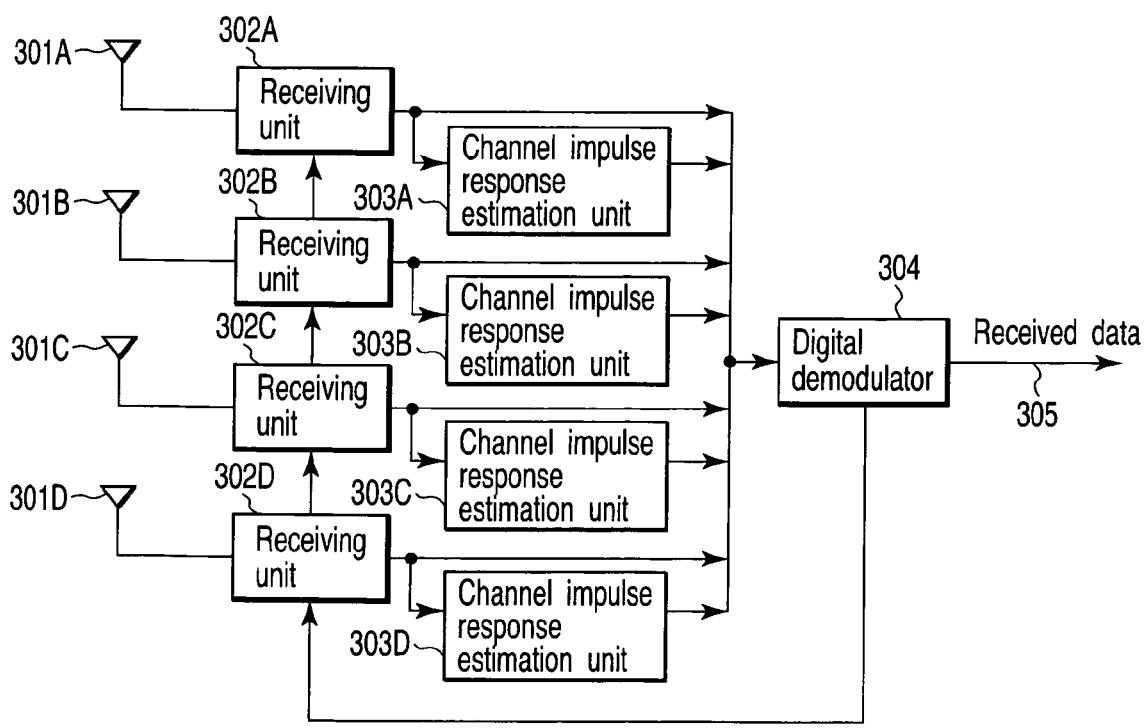
FIG. 3 is a block diagram illustrating the configuration of a wireless receiving device according to the embodiment.

In the wireless receiving device shown in FIG. 3, a plurality of receiving antennas 301A to 301D receive RF signals transmitted from the wireless transmitting device shown in FIG. 2. The wireless receiving device may have one receiving antenna or multiple receiving antennas. The RF signals received by the receiving antennas 301A to 301D are sent to receiving units 302A to 302D, respectively. The receiving units 302A to 302D each perform various types of receiving processing, such as frequency conversion (down-conversion) from the RF band to BB (baseband), automatic gain control (AGC), analog-to-digital conversion, etc., thereby generating a baseband signal.

The baseband signals from the receiving units 302A to 302D are sent to channel impulse response estimation units 303A to 303D and digital demodulator 304. These units 303A to 303D estimate the impulse responses of the respective propagation paths between the wireless transmitting device of FIG. 2 and the wireless receiving device of FIG. 3. The channel impulse response estimation units 303A to 303D will be described later in detail. The digital demodulator 304 demodulates the baseband signals based on the estimated channel impulse response provided by units 303A to 303D, thereby generating received data 305 corresponding to the transmission data 201 shown in FIG. 2.

More specifically, the digital demodulator 304 has an equalizer of the channel impulse response at its input section. The equalizer performs equalization for correcting the received signal distorted in the propagation path, based on the estimated channel impulse response. The digital demodulator 304 also demodulates the equalized signal at appropriate timing determined by the time synchronization, thereby reproducing data.

Figure 4:
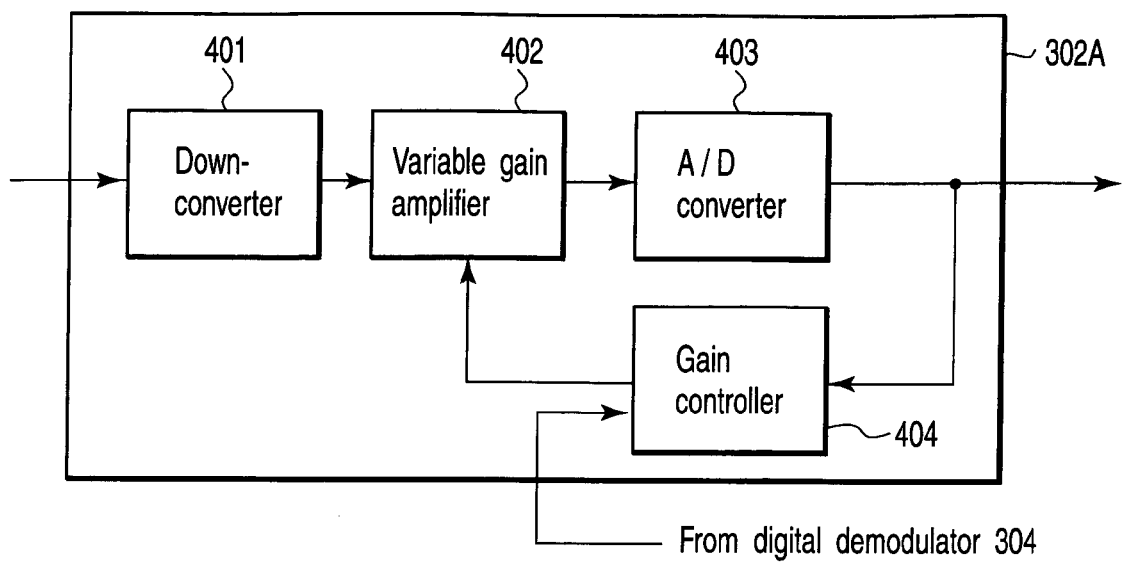
FIG. 4 is a block diagram illustrating a configuration example of a receiving unit incorporated in the device of FIG. 3.

The receiving units 302A to 302D shown in FIG. 3 will now be described. FIG. 4 shows the configuration of the receiving unit 302A in detail. Since the other receiving units 302B to 302D have the same configuration as the unit 302A, only the receiving unit 302A will be described. The RF received signal received by the receiving antenna 301A is down-converted by a down-converter 401 into a baseband signal. At this time, The RF signal may be directly converted into a baseband signal, or may be firstly converted into an intermediate frequency (IF) signal and then into a baseband signal.

The baseband signal generated by the down-converter 401 is sent to a variable gain amplifier 402, where it is subjected to perform AGC, i.e., signal level adjustment. The signal output from the variable gain amplifier 402 is sampled and quantized by an A/D converter 403. The digital signal output from the A/D converter 403 is sent to the outside of the receiving unit 302 and to a gain controller 404. The gain controller 404 performs gain calculation based on the digital signal output from the A/D converter 403, and controls the gain of the variable gain amplifier 402. The specific procedure for the gain control will be described later.

The operation of the wireless receiving device shown in FIGS. 3 and 4 executed for receiving the wireless packet including the preamble whose format is shown in FIG. 1 is as follows. Firstly, the wireless receiving device receives a short-preamble sequence 101 transmitted from the transmit antenna 205A of FIG. 2, and then performs packet edge detection, time synchronization, auto frequency control (AFC) and AGC, using a baseband signal corresponding to the short-preamble sequence 101. AFC is also called frequency synchronization. Packet edge detection, time synchronization and AFC can be performed using known techniques, therefore no description will be given thereof. Only AGC will be explained below.

The baseband signal corresponding to the short-preamble sequence 101 is amplified by the variable gain amplifier 402 in accordance with a predetermined initial gain value. The signal output from the variable gain amplifier 402 is input to the gain controller 404 via the A/D converter 403. The gain controller 404 calculates a gain from the level of the received signal corresponding to the short-preamble sequence 101, which is acquired after A/D conversion, and controls the gain of the variable gain amplifier 402 in accordance with the calculated gain.

Assume here that the level of the baseband signal corresponding to the short-preamble sequence 101, which is acquired before A/D conversion, is X. If level X is high, the baseband signal input to the A/D converter 403 exceeds the upper limit of the input dynamic range of the A/D converter 403. As a result, the signal (digital signal) output from the A/D converter 403 is saturated and degraded the quality of signal reception. On the other hand, if level X is extremely low, the signal output from the A/D converter 402 (i.e., the digital signal acquired by A/D conversion) suffers a severe quantization error. Thus, when level X L is very high or low, the A/D converter 403 cannot perform appropriate conversion, thereby significantly degrading the quality of signal reception.

To overcome this problem, the gain controller 404 controls the gain of the variable gain amplifier 402 so that the level X of the baseband signal corresponding to the short-preamble sequence 101, is adjusted to a target value Z. If the input baseband signal has such a very high level as makes the output of the A/D converter 403 limited to its upper limit level, or if it has a very low level, the gain of the variable gain amplifier 402 may not appropriately be controlled by one control process. In this case, gain control is performed repeatedly. As a result, the level of the baseband signal input to the A/D converter 403 can be adjusted to a value that falls within the input dynamic range of the A/D converter 403. Thus, the gain of the variable gain amplifier 402 is appropriately controlled using the baseband signal corresponding to the short-preamble sequence 101, thereby performing appropriate A/D conversion to avoid a reduction in the quality of signal reception.

In the above-described embodiment, the reception level needed for calculating the gain of the variable gain amplifier 402 is measured using a digital signal output from the A/D converter 403. However, such level measurement can be executed using an analog signal acquired before A/D conversion. Furthermore, the reception level may be measured in the IF band or RF band, instead of BB.

The wireless receiving device receives a first long-preamble sequence 102 transmitted from the transmit antenna 205A, and performs the estimation of channel impulse response, i.e., estimates the response (frequency transfer function) of the propagation path between the wireless transmitting device to the wireless receiving device, using a baseband signal corresponding to the long-preamble sequence 102. Since the signal transmitted from the transmit antenna 205A has already been subjected to AGC as described above, the level of an input to the A/D converter 403 is appropriately adjusted when the estimation of channel impulse response is performed. Accordingly, concerning the signal transmitted from the transmit antenna 205A, a highly accurate digital signal is acquired from the A/D converter 403. The estimation of channel impulse can be performed accurately with the acquired digital signal.

The wireless receiving device receives a first signal field 103 transmitted from the transmit antenna 205A, and demodulates a baseband signal corresponding to the first signal field 103, using the digital demodulator 304 and the above-mentioned propagation path estimation result. The first signal field 103 contains information indicating the modulation scheme and wireless packet length of data to be sent after the preamble. The first signal field 103 is a field that conveys a kind of attribute information regarding the wireless packet. The wireless receiving device continues demodulation using the digital demodulator 304 during the duration of a wireless packet recognized from the wireless packet length information contained in the first signal field 103.

Since the packet format from the short-preamble sequence 101 to the first signal field 103 provides interoperability with IEEE802.11a stations, IEEE 802.11a station is able to perform normal receiving operation without destroying the wireless packet. In other words, another IEEE 802.11a wireless transmitting and receiving device conforming to the IEEE 802.11a standard (a legacy station), upon receiving the first signal field 103, is prohibited to transmit a signal until the wireless packet ends so as not to destroy the wireless packet.

Subsequently, the wireless receiving device receives a second signal field 104 transmitted from the transmit antenna 205A. The second signal field 104 contains identification information indicating a wireless packet that corresponds to a standard other than IEEE 802.11a, e.g., IEEE 802.11n. In other words, the second signal field 104 indicates that subsequent AGC preambles 105A to 105D, second long-preamble sequences 106A to 109A, 106B to 109B, 106C to 109C and 106D to 109D are signals corresponding to, for example, IEEE 802.11n.

The wireless receiving device receives AGC preambles 105A to 105D transmitted from the transmit antennas 205A to 205D in parallel. The AGC preambles 105A to 105D are transmitted from the transmit antenna 205A that has transmitted the short-preamble sequence 101, first long-preamble sequence 102, first signal field 103 and second signal field 104, and from the transmit antennas 205B to 205D that have transmitted no signal so far. Accordingly, while the signals transmitted from the transmit antenna 205A (i.e., the short-preamble sequence 101, first long-preamble sequence 102, first signal field 103 and second signal field 104) are received with a certain receiving level, the AGC preambles 105A to 105D are received with different receiving levels from the level of the reception signal coming from the transmit antenna 205A. In other words, the reception level is changed after the MIMO transmission using the multiple transmit antenna.

As described above, the wireless receiving device receives the second signal field 104 and demodulates it using the digital demodulator 304, thereby recognizing that the present wireless packet corresponds to IEEE 802.11n. After that, the digital demodulator 304 issues an instruction to restart AGC for fine tune to the receiving units 302A to 302D, thereby re-executing AGC on the AGC preambles 105A to 105D. As a result, the signals transmitted from the transmit antennas 205A to 205D via the MIMO channel and received at the receiving units 302A to 302D, are input to the A/D converter 403 with an appropriately adjusted receiving level.

That is, using the level of baseband signals corresponding to the AGC preambles 105A to 105D, which is acquired after A/D conversion as shown in FIG. 4, gain control is performed on the variable gain amplifier 402. The time at which the digital demodulator 304 issues the instruction to start AGC using the AGC preambles 105A to 105D is not limited to the time at which the decoding result of the second signal field 104 is acquired. For instance, the digital demodulator 304 may confirm, using, for example, a matched filter, the reception of the AGC preambles 105A to 105D, and then supply the receiving units 302A to 302D with an instruction to start AGC.

In the preamble proposed by Jan. Boer, which is described before, AGC is performed only using a short-preamble sequence (legacy short preamble), transmitted from a single transmit antenna. AGC is performed using a reception level with which the signal transmitted from the antenna where the short-preamble sequence transmits. When a wireless receiving device receives signals transmitted from other three antennas, the device executes gain control by using the acquired gain.

Figure 5:
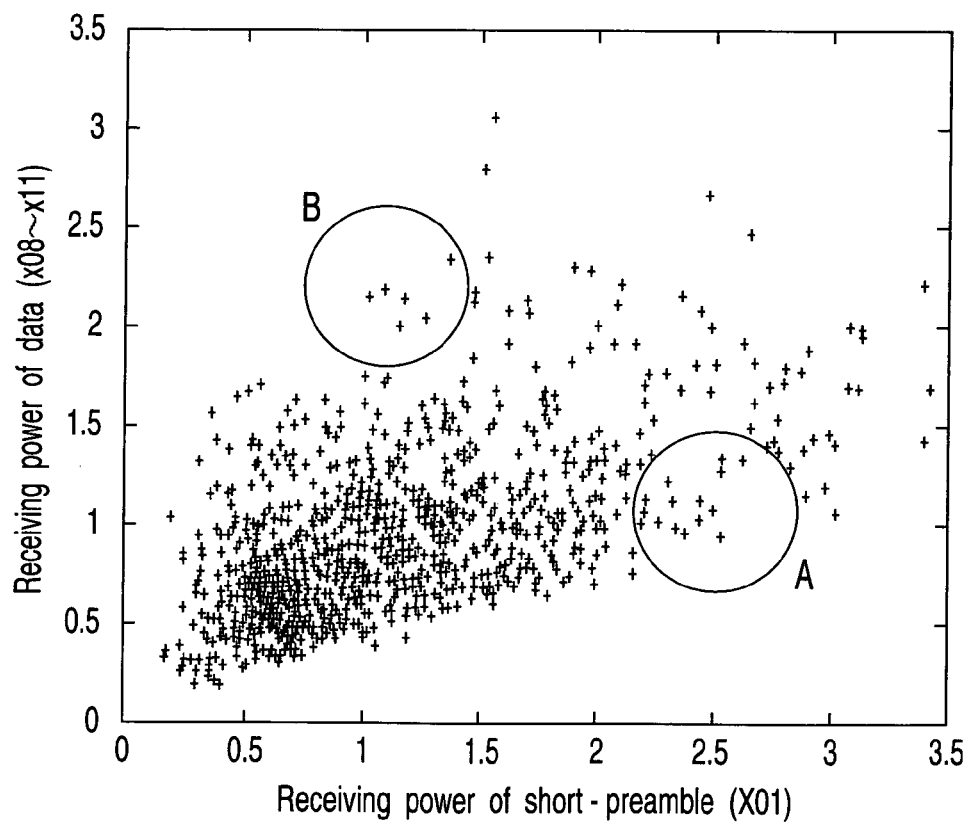
FIG. 5 is a graph illustrating the distribution of the receiving power of short preambles and data in the prior art.

FIG. 5 is a graph illustrating the distribution of the receiving power of a short preamble and data, acquired when Jan Boer's proposed preamble is utilized. The channel is in a multipath environment with a delay spread of 50 nsec (the duration for one data symbol is 4 μsec). As is evident from this figure, the ratio of the receiving level of short preamble (legacy short preamble) to the receiving level of the data varies significantly.

In, for example, region A in FIG. 5, the short preamble is received with a high receiving level, although the receiving level of data is low. Accordingly, if AGC is adjusted in accordance with the receiving power of the short preamble, the receiving power of the data is lower than the receiving power of the short preamble, resulting in a quantization error in the A/D converter 403. In region B in FIG. 5, the short preamble is received with a low receiving level, although the receiving level of data is high. Accordingly, if AGC is adjusted in accordance with the receiving power of the short preamble, the output of the A/D converter when data is input is saturated. Thus, it is understood that since, in the conventional scheme, the receiving power ratio of data to the short-preamble is not constant; the receiving characteristic is degraded because of a quantization error or saturation in the output of the A/D converter.

Figure 6:
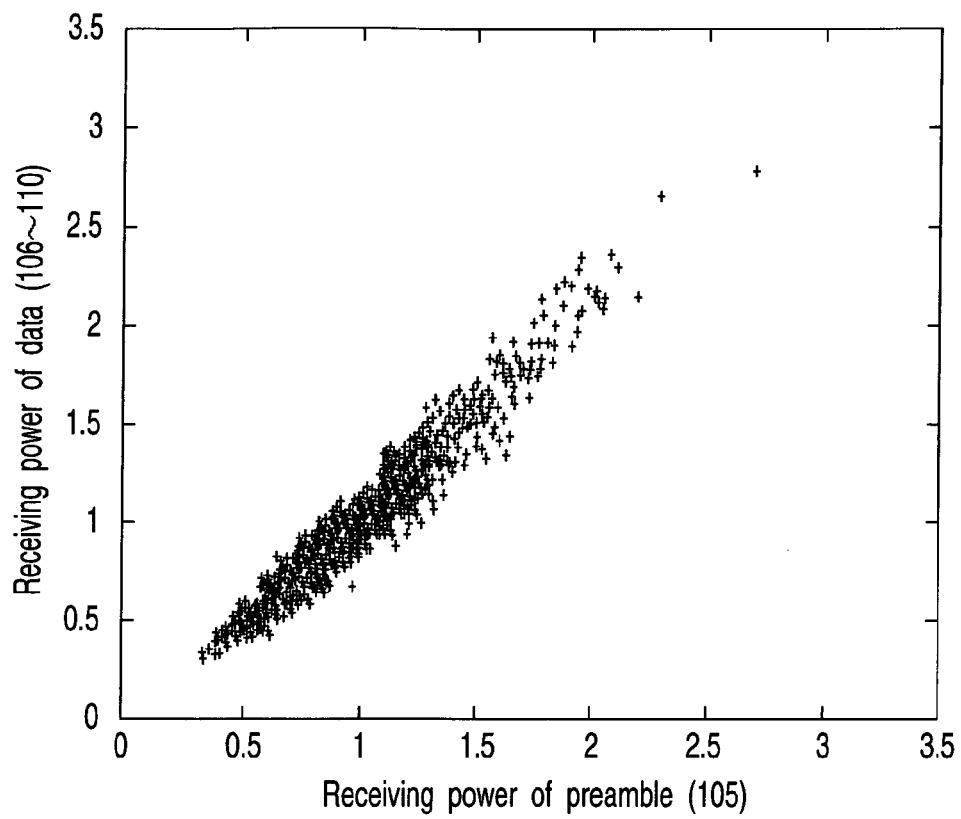
FIG. 6 is a graph illustrating the distribution of the receiving power of short preambles and data in the embodiment.

On the other hand, in the embodiment, all antennas 205A to 205D that transmit data signals transmit AGC preambles 105A to 105D, respectively. FIG. 6 shows the distribution of the receiving power of the short-preambles and data, according to the embodiment. The channel environment is the same as in the case of FIG. 5.

As shown in FIG. 6, the receiving power of the AGC preambles is substantially proportional to that of the data 110A to 110D. This indicates that the input level of the A/D converter is adjusted so appropriate that the receiving accuracy is remarkably enhanced as compared to the FIG. 5.

Figure 7:
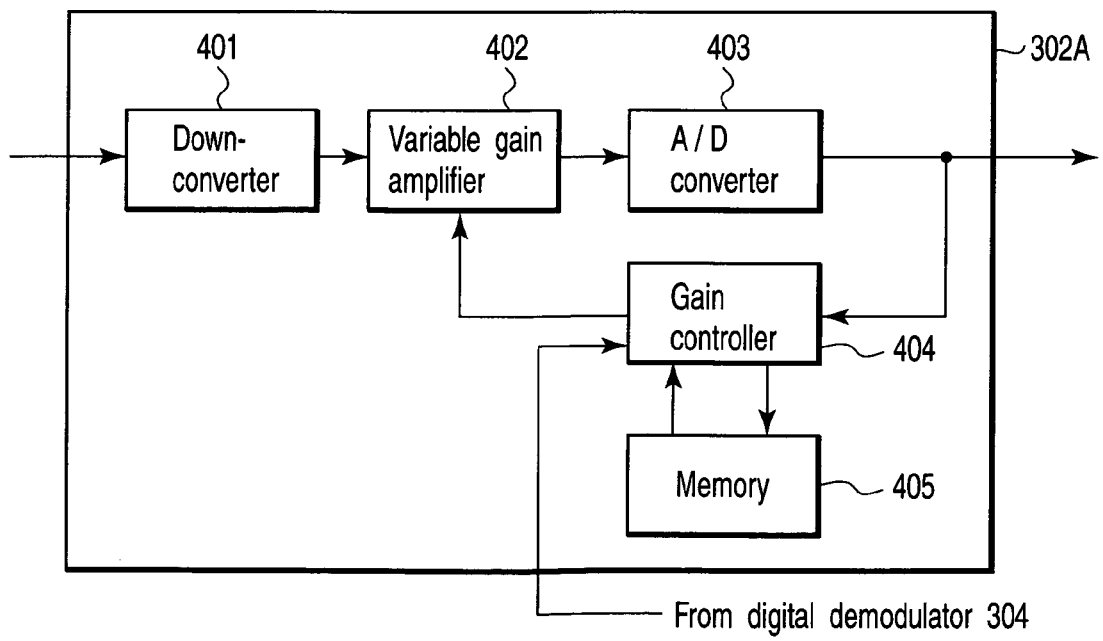
FIG. 7 is a block diagram illustrating another configuration example of the receiving unit.

FIG. 7 shows a modification of the receiving unit 302A. In general, to detect an unknown signal, the variable gain amplifier 402 uses a relatively large gain as the initial value. Accordingly, if the gain of the variable amplifier 402 is initialized when the AGC preambles 105A to 105D are received, it is necessary to repeat gain control until the gain is stabilized. The modification shown in FIG. 7 provides a memory 405. This memory 405 stores the gain value acquired after the AGC was executed with the short-preamble sequence 101. When receiving the AGC preambles 105A to 105D, if the gain of the amplifier 402 is not returned to the initial value set in the standby state, but the gain read from the memory 405 is used as its initial value, AGC can be performed not only accurately but also finished in a short time compare to the case without using such stored value.

Figure 8A:
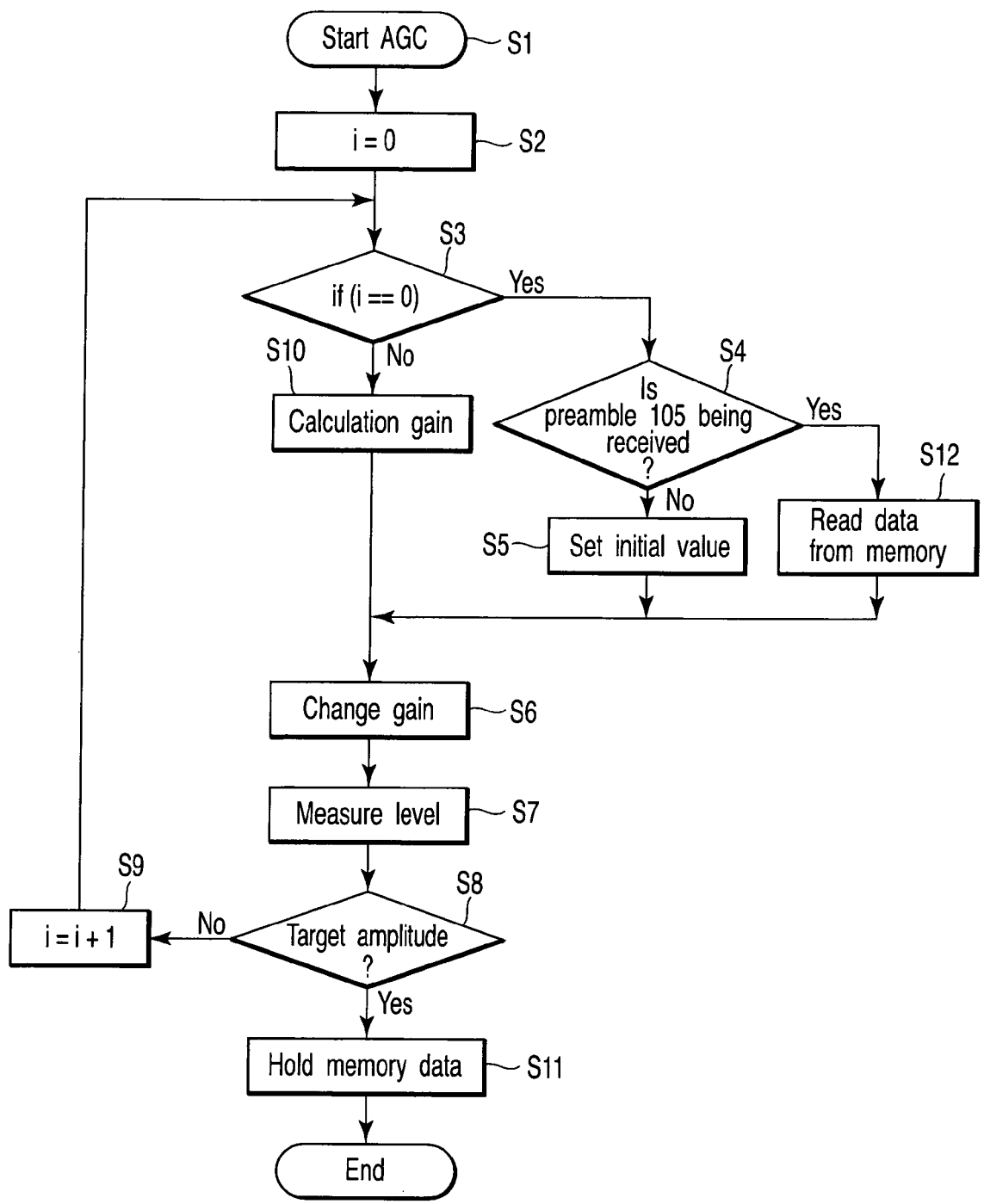
FIG. 8A is a flowchart in explaining the operation of a gain controller.

Referring then to the flowchart of FIG. 8A, the operation of the gain controller 404 will be described in detail.

Upon receiving the head of the short-preamble sequence 101, the receiving device starts AGC (step S1).

Subsequently, zero is set as a counter value (i) (step S2).

Subsequently, referring to the counter value, it is determined whether AGC is in the initial stage or middle stage (step S3). At this time, since the counter value is zero, the answer to the question at step S3 is YES, thereby proceeding to step S4.

After that, it is determined whether the preamble 105 is now being received (step S4). In this case, since the short-preamble sequence 101 as the head of a wireless packet is being received, the answer to the question at step S4 is NO, thereby proceeding to step S5. At step S5, a predetermined initial value is set.

At the next step S6, the amplification factor of the variable gain amplifier is changed in accordance with the set initial value. At the next step S7, the receiving level of the present short-preamble sequence is measured. It is determined at step S8 whether the measured level is an appropriate level (target level) for the A/D converter. If the answer to the question at step S8 is NO, the program proceeds to step S9.

At step S9, the counter value is implemented, and then the program returns to step S3. At step S3, it is determined that i is not zero, the program proceeds to step S10. At step S10, gain calculation is performed using the level measured at step S7.

Thus, the loop of S10→S6→S7→S8→S9 is repeated until the receiving level reaches the target level. When the receiving level has reached the target level, the set gain is written to the memory 405 at step S11, thereby finishing AGC performed on the signal transmitted from the antenna Tx1. This AGC operation (first AGC) plays a role as "a coarse AGC" at the receiving device by contrast with the next fine AGC operation (second AGC) for MIMO reception using the AGC preambles 105 which will be described later.

The receiving unit 302A then receives the long-preamble sequence 102, first signal field 103 and second signal field 104. The receiving unit 302A starts AGC for MIMO reception with the AGC preambles 105. AGC starts from step S1, and shifts to S2, S3 and S4. At step S4, since the receiving unit 302A is receiving the AGC preambles 105, the program proceeds to step S12, thereby reading the gain value previously written to the memory 405 and followed by step S6. After step S6, the same process as the above is performed.

Figure 8B:
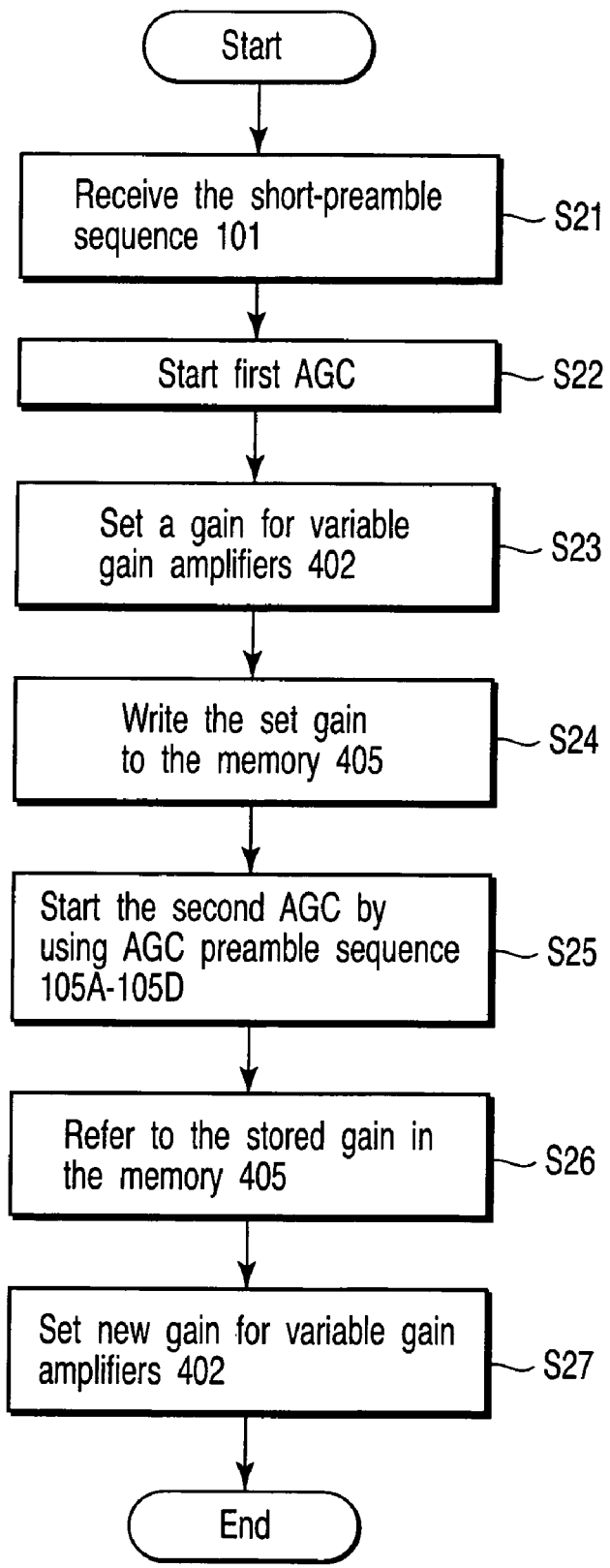
FIG. 8B is a flowchart showing a first AGC operation and second AGC operation.

The flow discussed above is summarized as follows. The summarized flow chart is shown in FIG. 8B. First, receive the short-preamble sequence 101 at wireless receiving device (step S21). Then, start the first AGC operation (step S22) and set a gain for variable gain amplifiers 402A to 402D (step S23). Then, write the set gain to the memory 405 (step S24). After the first AGC operation, then start the second AGC operation with the result of the reception of the AGC preambles 105A to 105D transmitted from multiple transmit antennas by using MIMO technique (step S25). Then, refer to the gain written in the memory 405 (step S26) and set new gain for each of variable gain amplifiers 402A to 402D (step 27).

Thus, when receiving the AGC preambles 105A to 105D, the gain is not returned to the initial value set in the standby state, but the gain, which is acquired by the first AGC, stored in the memory 405 is used as the initial value. Because of this operation, the AGC preambles 105A to 105D enables the wireless receiving device to perform fine AGC in MIMO reception with a short time period. This fine AGC provides sufficient accuracy for the MIMO reception.

Figure 9:
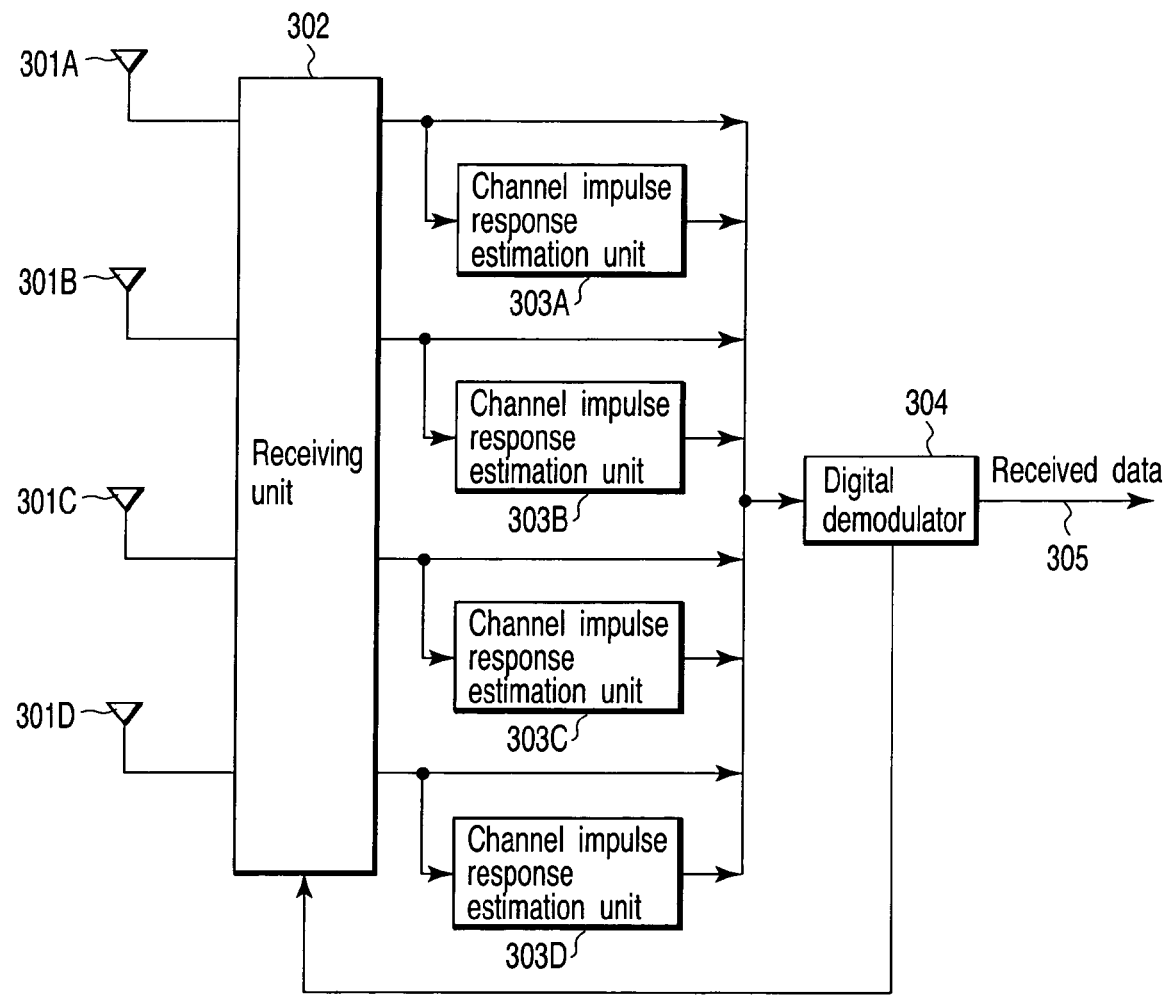
FIG. 9 is a block diagram illustrating a wireless receiving device according to a modification of the embodiment.

FIG. 9 is a view illustrating a modification of the wireless receiving device of FIG. 3, in which AGC is commonly performed. FIG. 9 differs from FIG. 3 in which in the former, a common receiving unit 302 is provided for the antennas 301A to 301D.

Figure 10:
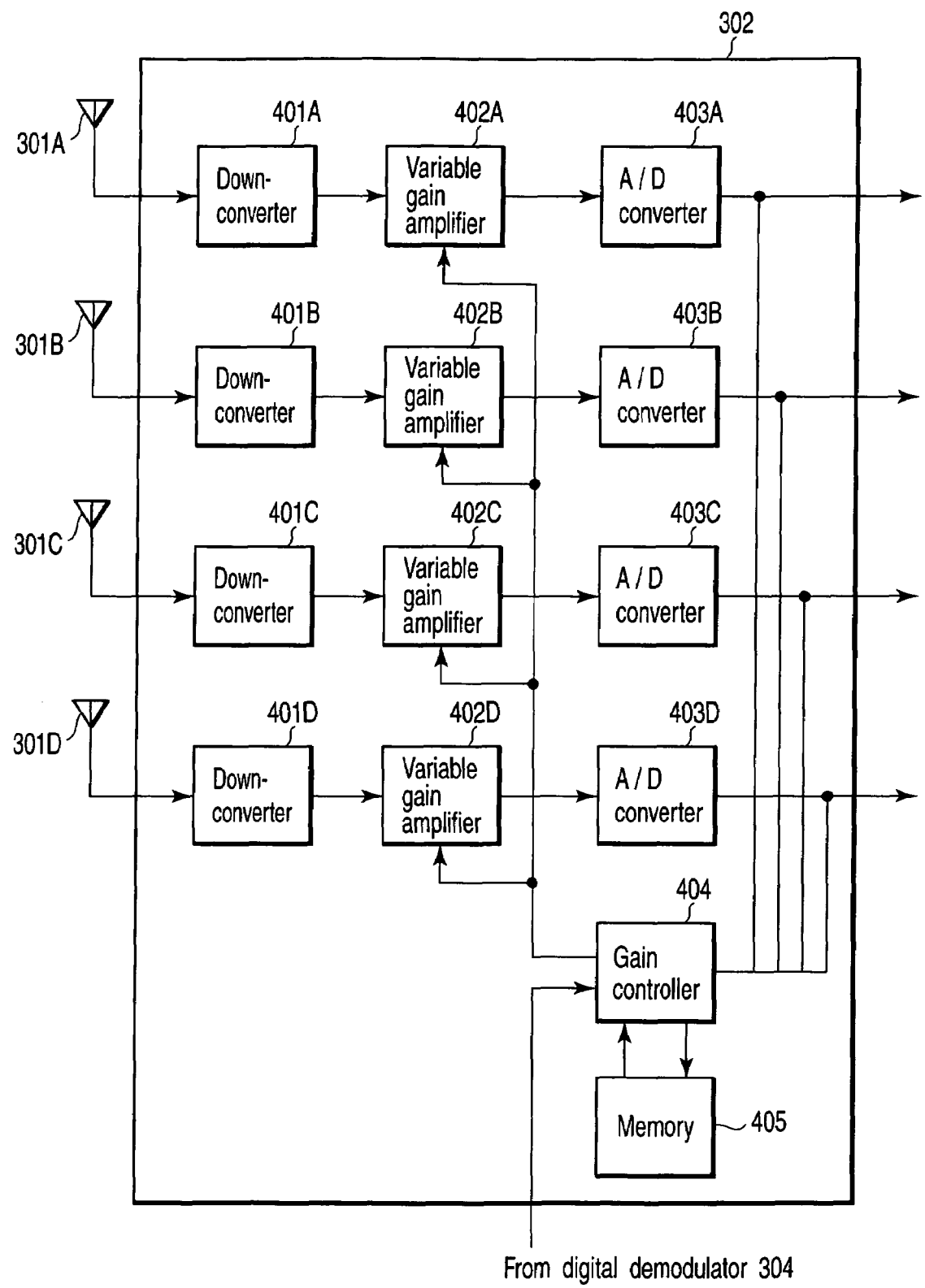
FIG. 10 is a block diagram illustrating a configuration example of a receiving unit incorporated in the wireless receiving device of FIG. 9.

FIG. 10 shows the receiving unit 302 of FIG. 9 in detail. The configuration of FIG. 10 differs from that of FIG. 7 in that in the former, a single gain controller 404 and a memory 405 for storing a gain value acquired using the short-preamble sequence 101 are commonly provided for the antennas 301A to 301D.

Specifically, the output signals of the antennas 301A to 301D are input to A/D converters 403A to 403D via down-converters 401A to 401D and variable gain amplifiers 402A to 402D, respectively. The output signals of the A/D converters 403A to 403D are input to the common gain controller 404. The gain determined by the gain controller 404 is commonly input to the variable gain amplifiers 402A to 402D. For example, the gain, which enables the highest one of the levels acquired after A/D conversion by the A/D converters 403A to 403D to be set as a target Z, may be commonly input to the variable gain amplifiers 402A to 402D.

Also in the receiving device shown in FIGS. 9 and 10, the digital demodulator 304 confirms the reception of the short-preamble sequence 101 and supplies the receiving unit 302 with an instruction to start the first AGC. After that, the digital demodulator 304 confirms the reception of the second signal field 104 or AGC preambles 105, and supplies the receiving unit 302 with an instruction to start the second AGC for MIMO reception mode.

Thereafter, the wireless receiving device receives the second long-preamble sequences 106A to 109A, 106B to 109B, 106C to 109C and 106D to 109D, which are transmitted after the AGC preambles 105A to 105D from the transmission antennas 205A to 205D. The unit preambles LP that form the second long-preamble sequences 106A to 109A, 106B to 109B, 106C to 109C and 106D to 109D are basically the same signals as those forming the first long-preamble sequence 102.

Further, the second long-preamble sequences 106A to 109A, 106B to 109B, 106C to 109C and 106D to 109D are signals subjected to orthogonalization using Walsh sequences. In other words, in FIG. 1, each unit preamble with symbol "−LP" has a polarity reverse to that of each unit preamble with symbol "LP". The wireless receiving device receives the second long-preamble sequences 106A to 109A, 106B to 109B, 106C to 109C and 106D to 109D, which are synthesized with each other. As will be described later, the signals transmitted from the transmit antennas 205A to 205D are reproduced by multiplying the second long-preamble sequences by Walsh sequences.

Figure 11:
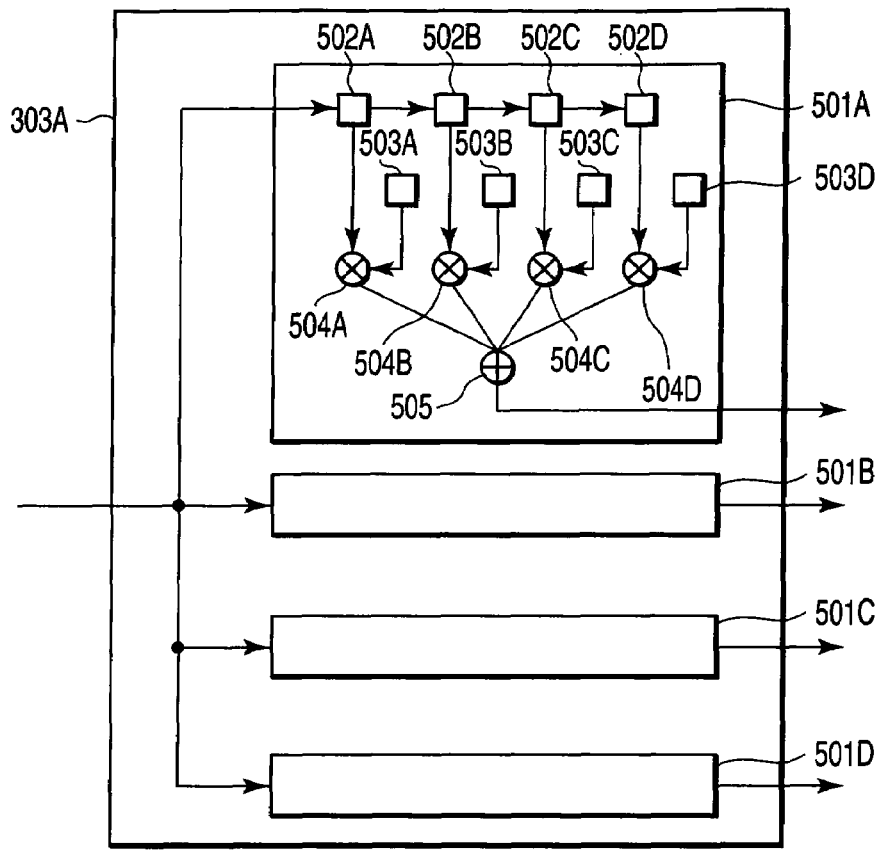
FIG. 11 is a block diagram illustrating a configuration example of the propagation path estimation unit appearing in FIG. 3.

A detailed description will be given of the channel impulse response estimation units 303A to 303D. FIG. 11 illustrates the channel impulse response estimation unit 303A in detail. Since the other estimation units are similar to the estimation unit 303A, only the estimation unit 303A will be described. The channel impulse response estimation unit 303A comprises estimation units 501A to 501D for estimating the responses of the propagation paths between the receiving antenna 301A and the antennas Tx1 to Tx4 (corresponding the transmit antennas 205A to 205D) of a wireless transmitting device, respectively.

The estimation unit 501A includes data memories 502A to 502D for storing the respective symbol of the received second long-preamble sequence, coefficient memories 503A to 503D for storing respective coefficients by which the respective symbol of the received second long-preamble sequence is be multiplied, multipliers 504A to 504D and an adder 505. The other estimation units 501B to 501D have the same structure as the estimation unit 501A, except for the value of the coefficients by which the respective symbols of the received second long-preamble sequences is be multiplied. The data memories 502A to 502D are connected in series, thereby forming a shift register.

In the estimation unit 501A, the received second long-preamble sequences 106A to 109A, 106B to 109B, 106C to 109C and 106D to 109D are stored in the data memories 502A to 502D. Specifically, the memory 502A stores the value of the signal acquired by combining the long-preamble sequence 106A to 106D included in the second long-preamble sequences. Similarly, the memory 502B stores the value of the signal acquired by combining the long-preamble sequence 107A to 107D, the memory 502C stores the value of the signal acquired by combining the long-preamble sequence 108A to 108D, and the memory 502D stores the value of the signal acquired by combining the long-preamble sequence 109A to 109D.

Assuming that the responses of the propagation paths between the transmit antennas 205A to 205D and the receiving antenna 301A are h1, h2, h3 and h4, signal values $S_{502A}$, $S_{502B}$, $S_{502C}$ and $S_{502D}$ stored in the data memories 502A, 502B, 502C and 502D, respectively, are given by $$S_{502A} = LP^*h_1 + LP^*h_2 + LP^*h_3 + LP^*h_4 \quad (1)$$

$$S_{502B} = LP^*h_1 + LP^*h_2 - LP^*h_3 - LP^*h_4 \quad (2)$$

$$S_{502C} = LP^*h_1 - LP^*h_2 - LP^*h_3 + LP^*h_4 \quad (3)$$

$$S_{502D} = LP^*h_1 - LP^*h_2 + LP^*h_3 - LP^*h_4 \quad (4)$$

The multipliers 504A, 504B, 504C and 504D multiply the signal values, stored in the data memories 502A, 502B, 502C and 502D, by the coefficients stored in the coefficient memories 503A, 503B, 503C and 503D, respectively. In the estimation unit 501A, a coefficient of 1 is stored in all coefficient memories 503A, 503B, 503C and 503D for the estimation of channel impulse response between the transmit antenna 205A and the receiving antenna 301A. That is, the coefficients stored in the coefficient memories 503A, 503B, 503C and 503D are expressed by a sequence of (1, 1, 1, 1).

Thereafter, the adder 505 adds the multiplication results of the multipliers 504A to 504D. In this case, the signal values $S_{502A}$, $S_{502B}$, $S_{502C}$ and $S_{502D}$ given by the equations (1) to (4) are added. As is evident from the equations (1) to (4), only the long preamble PL and the value h1 that indicates the channel impulse response between the antenna Tx1 (transmit antenna 205A) and the receiving antenna remain as the addition result. If unit preambles PL that form a long-preamble sequence are each provided as a predetermined bit pattern for the wireless transmitting device and wireless receiving device, the channel impulse response between the transmit antenna 205A and the receiving antenna 301A can be estimated from the received signal acquired by combining the signals transmitted from all transmit antennas 205A to 205D.

On the other hand, in the estimation units 501B, 501C and 501D, the coefficient memories 503B, 503C and 503D store Walsh sequences of (1, 1, −1, −1), (1, −1, −1, 1) and (1, −1, 1, −1), respectively. As a result, the estimation units 501B, 501C and 501D can estimate the channel impulse response between the antennas Tx2, Tx3 and Tx4 (transmit antennas 205B, 205C and 205D) and the receiving antenna 301A, respectively.

As described above, the channel impulse response estimation unit 303A estimates the response of the propagation path between each of the transmit antennas 205A to 205D and the receiving antenna 301A. Similarly, the channel impulse response estimation units 303B to 303C estimate the channel impulse response between the transmit antennas 205A to 205D and the receiving antennas 301B to 301C.

In AGC using the AGC preambles 105A to 105D, gain control is performed using, as an initial value, the value of the gain of the variable gain amplifier 402 adjusted using a signal transmitted from a single transmitting antenna 205A, with the result that fine and fast gain control can be achieved. Examples of the AGC preambles 105A to 105D will now be described. The AGC preambles 105A to 105D shown in FIG. 12 (a), (b), (c) and (d) are each formed of a signal sequence including a plurality of time-domain samples (ten samples in the case of FIG. 12). The AGC preamble 105A transmitted from the antenna Tx1, for example, comprises a sequence of (a0, a1, a2, ..., a8, a9).

Figure 12:
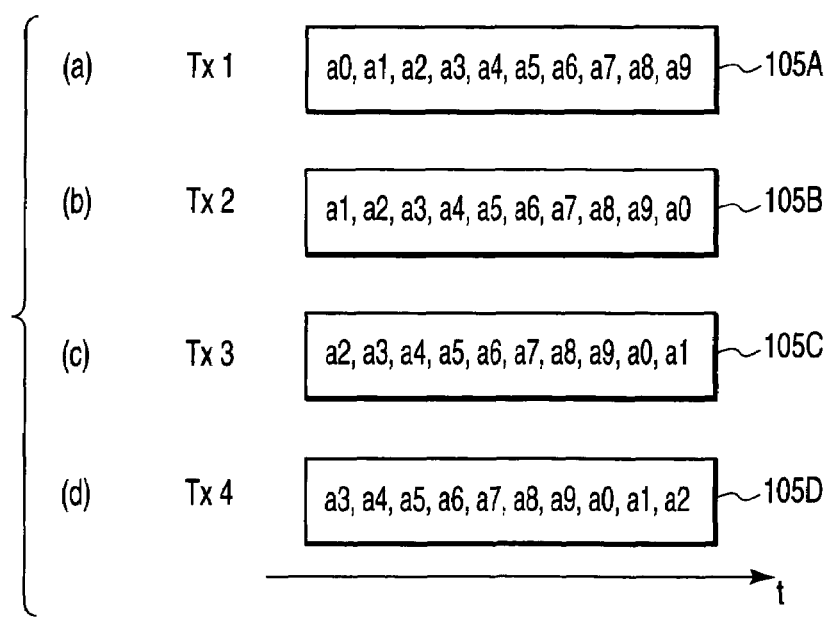
FIG. 12 is a view illustrating structural examples of the AGC preambles appearing in FIG. 1.

Further, the AGC preambles 105A to 105D shown in FIG. 12 (a), (b), (c) and (d) are formed by cyclic shifting the samples in time domain of a single signal sequence. Specifically, a signal sequence acquired by cyclic shifting of the samples in time domain of an AGC preamble sequence transmitted from a certain reference antenna is an AGC preamble sequence transmitted from another antenna. For example, the AGC preamble sequence 105B transmitted from the antenna Tx2 is (a1, a2, ..., a9, a0), which is acquired by cyclic shifting, by one sample, the temporal positions of the samples of the AGC preamble 105A transmitted from the reference antenna Tx1.

Similarly, the AGC preamble 105C transmitted from the antenna Tx3 is acquired by cyclic shifting, by two samples, the temporal positions of the samples of the AGC preamble 105A transmitted from the reference antenna Tx1. The AGC preamble 105D transmitted from the antenna Tx4 is acquired by cyclic shifting, by three samples, the temporal positions of the samples of the AGC preamble 105A transmitted from the antenna Tx1 as reference.

If the AGC preambles 105A to 105D are formed of signal sequences identical to each other, they may well interfere with each other during transmission. Such interference may cause an electric field similar to that occurring when directional antenna transmission is performed, depending upon a multipath state or receiving point. As a result, a null point may occur. In other words, there may occur a receiving point at which none of the AGC preambles can be received and the receiving level may not accurately be measured.

In the embodiment, a multipath formed of signal sequences (i.e., the AGC preambles 105A to 105D) that are acquired by cyclic shifting the temporal positions of their samples is intentionally created. In this case, even if the receiving level of a certain sample in the signal sequences is reduced because of signal interference, the probability of occurrence of a reduction in the receiving level of another sample is low. Therefore, accurate receiving level measurement is realized, which enhances the receiving performance of the wireless receiving device. For instance, a communication system can be realized which is not against a protocol, CSMA/CA (Carrier Sense Multiple Access with Collision Avoidance), stipulated in IEEE, 802.11.

FIG. 13 (a) to (d) show other examples of the AGC preambles 105A to 105D. The AGC preambles 105A to 105D shown in FIG. 12 (a) to (d) are time-domain signal sequences acquired by cyclic shifting the temporal positions of their samples to each other. On the other hand, the AGC preambles 105A to 105D shown in FIG. 13 (a) to (d) are frequency-domain signal sequences, and have different frequency components. In FIG. 13, f0 to f15 indicate subcarrier frequencies, and the hatched subcarriers carry signals, while non-hatched subcarriers do not carry signals.

For example, the AGC preamble 105A transmitted from the antenna Tx1 is formed of subcarriers f0, f4, f8 and f12. Similarly, the AGC preamble 105B transmitted from the antenna Tx2 is formed of subcarriers f1, f5, f9 and f13. The AGC preamble 105C transmitted from the antenna Tx3 is formed of subcarriers f2, f6, f10 and f14. Further, the AGC preamble 105D transmitted from the antenna Tx4 is formed of subcarriers f3, f7, f11 and f15. The subcarriers transmitted from the antenna Tx1 are not sent by any other antenna. Similarly, the subcarriers transmitted from the antenna Tx2 are not sent by any other antenna.

Figure 14:
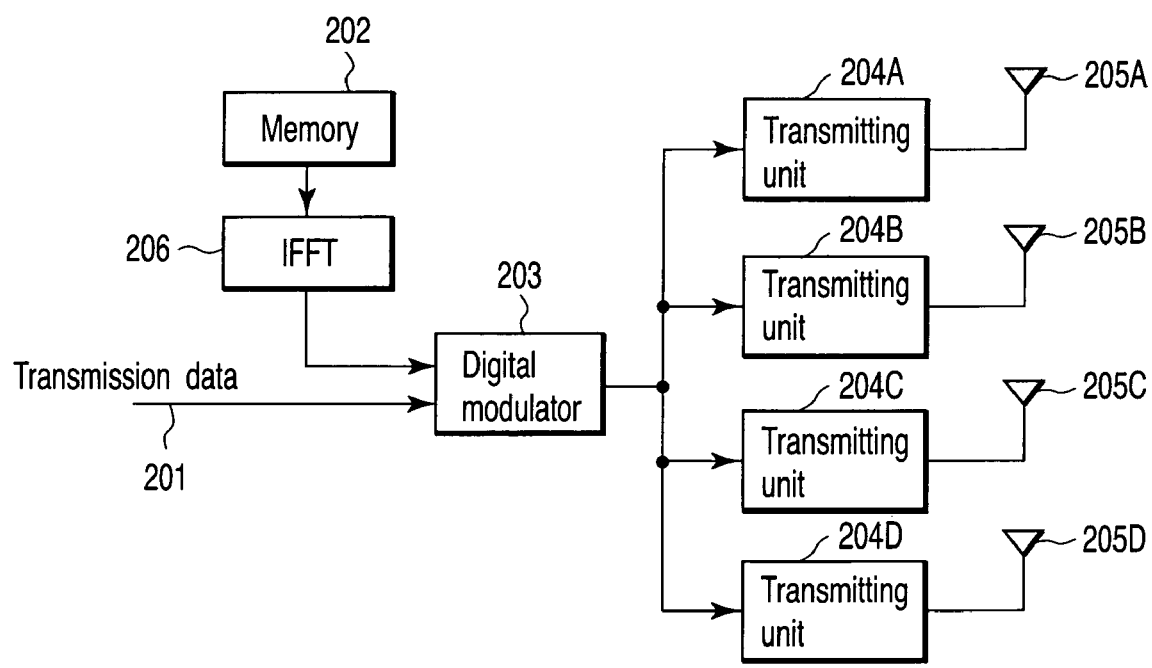
FIG. 14 is a view illustrating a wireless transmitting device according to another embodiment of the invention.

Actually, the AGC preambles 105A to 105D are transmitted after they are transformed into time-domain signal sequences by inverse fast Fourier transform (IFFT) or discrete Fourier transform (DFT). In the wireless transmitting device, as shown in FIG. 14, a memory 202 stores, as AGC preambles, data concerning the frequency-domain signal sequences as shown in FIG. 13 (a) to (d). The frequency-domain signal sequence data read from the memory 202 is transformed into time-domain signal sequences by an IFFT circuit 206, and input to a digital modulator 203. The digital modulator 203 may incorporate the function of the IFFT circuit 206. Furthermore, the memory 202 may pre-store time-domain signal sequence data into which the frequency-domain signal sequence data shown in FIG. 13 (a) to (d) is transformed. In this case, the IFFT circuit 206 is not needed.

As shown in FIG. 13 (a) to (d), since the AGC preambles 105A to 105D are frequency interleaved across four antennas, the signals from the antennas Tx1 to Tx4 do not contain the same frequency component, therefore can reach the wireless receiving device without interfering with each other. As a result, the wireless receiving device can perform accurate receiving level measurement and hence exhibit high receiving performance.

The present invention is not limited to the above-described embodiments, but may be modified in various ways without departing from the scope. For instance, in the embodiments shown in FIG. 2, digital-to-analog (D/A) conversion is performed in transmission units 204A to 204D respectively. But, it can be modified that digital modulator 203 performs such D/A conversion instead of the transmission units 204A to 204D. Similarly, the embodiments shown in FIG. 3, analog-to-digital (A/D) conversion is performed in receiving units 302A to 302D respectively. But, it can be modified that such A/D conversion is performed by digital demodulator 304 instead of the units 302A to 302D.

With regard to the packet format, the short-preamble sequence 101, first long-preamble sequence 102, first signal field (SIGNAL) 103 and second signal field (SIGNAL 2) 104 are transmitted from antenna Tx1 as shown in FIG. 1. But, it can be possible that such preamble signal is transmitted from at least one transmitted antenna. It is possible that each of the second long-preamble sequences may have different frequency components like the AGC preambles 105A to 105D shown in FIG. 13 (a) to (d).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A wireless transmitting device for communicating with a wireless receiving device by using a wireless packet, the wireless transmitting device comprising:
  a signal generator configured to generate a signal for transmitting the wireless packet, the wireless packet including:
    a short-preamble used for a first automatic gain control (1st AGC) at the wireless receiving device,
    a first long-preamble for estimating a channel impulse response between the wireless transmitting device and the wireless receiving device,
    a signal field following the short-preamble and the first long-preamble, and for conveying information regarding a length of the wireless packet,
    an AGC preamble following the signal field, and used for a second automatic gain control (2nd AGC) performed after the first automatic gain control at the wireless receiving device,
    a second long-preamble for estimating the channel impulse response between the wireless transmitting device and the wireless receiving device, and
    a data field conveying data;
  wherein the AGC preamble is transmitted in parallel via a plurality of antennas.

2. The wireless transmitting device according to claim 1, wherein
  the signal generator is configured to generate the signal for transmitting the wireless packet that includes the AGC preamble, which is formed by cyclic shifting of temporal positions, and
  an amount of cyclic shift is different for different ones of the antennas.

3. The wireless transmitting device according to claim 1, wherein the signal generator is configured to generate the signal for transmitting the wireless packet that includes the AGC preamble that is transmitted in parallel via the plurality of antennas, which use different frequency components.

4. The wireless transmitting device according to claim 1, wherein the signal generator is configured to generate the signal for transmitting the wireless packet that includes the signal field, which comprises:
  a first signal field conforming to IEEE 802.11a; and
  a second signal field indicating that the AGC preamble and the second long-preamble conform to a standard other than IEEE 802.11a.

5. The wireless transmitting device according to claim 1, wherein the signal generator is configured to generate the signal for transmitting the wireless packet that includes the second long-preamble, which is transmitted by the plurality of antennas in parallel and is orthogonalized with respect to another second long-preamble by using Walsh sequences.

6. A wireless transmitting device for communicating with a wireless receiving device by using a wireless packet, the wireless transmitting device comprising:
  a signal generator configured to generate a signal for transmitting the wireless packet, the wireless packet including:
    a short-preamble used for a first automatic gain control (1st AGC) at the wireless receiving device,
    a first long-preamble for estimating a channel impulse response between the wireless transmitting device and the wireless receiving device,
    a signal field following the short-preamble and the first long-preamble, and for conveying information regarding a length of the wireless packet,
    an AGC preamble following the signal field, and used for a second automatic gain control (2nd AGC) performed after the first automatic gain control at the wireless receiving device, a second long-preamble for estimating the channel impulse response between the wireless transmitting device and the wireless receiving device, and a data field conveying data;

wherein the AGC preamble and the data field are transmitted in parallel via a plurality of antennas.

7. The wireless transmitting device according to claim 6, wherein the signal generator is configured to generate the signal for transmitting the wireless packet that includes the AGC preamble, which is formed by cyclic shifting of temporal positions, and an amount of cyclic shift is different for different ones of the antennas.

8. The wireless transmitting device according to claim 6, wherein the signal generator is configured to generate the signal for transmitting the wireless packet that includes the AGC preamble that is transmitted in parallel via the plurality of antennas, which use different frequency components.

9. The wireless transmitting device according to claim 6, wherein the signal generator is configured to generate the signal for transmitting the wireless packet that includes the signal field, which comprises:

a first signal field conforming to IEEE 802.11a; and a second signal field indicating that the AGC preamble and the second long-preamble conform to a standard other than IEEE 802.11a.

10. The wireless transmitting device according to claim 6, wherein the signal generator is configured to generate the signal for transmitting the wireless packet that includes the second long-preamble, which is transmitted by the plurality of antennas in parallel and is orthogonalized with respect to another second long-preamble by using Walsh sequences.

11. A wireless transmitting device for communicating with a wireless receiving device by using a wireless packet, the wireless transmitting device comprising:

a signal generator configured to generate a signal for transmitting the wireless packet, the wireless packet including:

a short-preamble used for a first automatic gain control (1st AGC) at the wireless receiving device, a first long-preamble for estimating a channel impulse response between the wireless transmitting device and the wireless receiving device, a signal field following the short-preamble and the first long-preamble, and for conveying information regarding a length of the wireless packet, an AGC preamble following the signal field, and used for a second automatic gain control (2nd AGC) performed after the first automatic gain control at the wireless receiving device, a second long-preamble for estimating the channel impulse response between the wireless transmitting device and the wireless receiving device, and a data field conveying data;

wherein the AGC preamble and the data field are transmitted in parallel via a plurality of antennas, and the short-preamble, the first long-preamble, and the signal field are transmitted via at least one of the plurality of antennas.

12. The wireless transmitting device according to claim 11, wherein the signal generator is configured to generate the signal for transmitting the wireless packet that includes the AGC preamble, which is formed by cyclic shifting of temporal positions, and an amount of cyclic shift is different for different ones of the antennas.

13. The wireless transmitting device according to claim 11, wherein the signal generator is configured to generate the signal for transmitting the wireless packet that includes the AGC preamble that is transmitted in parallel via the plurality of antennas, which use different frequency components.

14. The wireless transmitting device according to claim 11, wherein the signal generator is configured to generate the signal for transmitting the wireless packet that includes the signal field, which comprises:

a first signal field conforming to IEEE 802.11a; and a second signal field indicating that the AGC preamble and the second long-preamble conform to a standard other than IEEE 802.11a.

15. The wireless transmitting device according to claim 11, wherein the signal generator is configured to generate the signal for transmitting the wireless packet that includes the second long-preamble, which is transmitted by the plurality of antennas in parallel and is orthogonalized with respect to another second long-preamble by using Walsh sequences.

16. A wireless transmitting device for communicating with a wireless receiving device by using a wireless packet, the wireless transmitting device comprising:

a signal generator configured to generate a signal for transmitting the wireless packet, the wireless packet including:

a short-preamble used for a first automatic gain control (1st AGC) at the wireless receiving device, a first long-preamble for estimating a channel impulse response between the wireless transmitting device and the wireless receiving device, a signal field following the short-preamble and the first long-preamble, and for conveying information regarding a length of the wireless packet, an AGC preamble following the signal field, and used for a second automatic gain control (2nd AGC) performed after the first automatic gain control at the wireless receiving device, a second long-preamble for estimating the channel impulse response between the wireless transmitting device and the wireless receiving device, and a data field conveying data;

wherein the AGC preamble and the data field are transmitted in parallel via a plurality of antennas, the short-preamble, the first long-preamble, and the signal field are transmitted via at least one of the antennas, the short-preamble, the first long-preamble, and the signal field are recognizable by both a first communication system and a second communication system, and the AGC preamble and the data field are recognizable by the second communication system.

17. The wireless transmitting device according to claim 16, wherein the second communication system has backwards compatibility with the first communication system.

18. The wireless transmitting device according to claim 17, wherein the signal generator is configured to generate the signal for transmitting the wireless packet that includes the second long-preamble, which is transmitted by the plurality of antennas in parallel and is orthogonalized with respect to another second long-preamble by using Walsh sequences.

19. The wireless transmitting device according to claim 17, wherein the signal generator is configured to generate the signal for transmitting the wireless packet that includes the signal field, which comprises:
- a first signal field conforming to IEEE 802.11a; and
- a second signal field indicating that the AGC preamble and the second long-preamble conform to a standard other than IEEE 802.11a.

20. The wireless transmitting device according to claim 17, wherein the signal generator is configured to generate the signal for transmitting the wireless packet that includes the AGC preamble that is transmitted in parallel via the plurality of antennas, which use different frequency components.

21. The wireless transmitting device according to claim 17, wherein
the signal generator is configured to generate the signal for transmitting the wireless packet that includes the AGC preamble, which is formed by cyclic shifting of temporal positions, and
an amount of cyclic shift is different for different ones of the antennas.

22. The wireless transmitting device according to claim 16, wherein the second communication system has interoperability with the first communication system.

23. The wireless transmitting device according to claim 22, wherein
the signal generator is configured to generate the signal for transmitting the wireless packet that includes the AGC preamble, which is formed by cyclic shifting of temporal positions, and
an amount of cyclic shift is different for different ones of the antennas.

24. The wireless transmitting device according to claim 22, wherein the signal generator is configured to generate the signal for transmitting the wireless packet that includes the AGC preamble that is transmitted in parallel via the plurality of antennas, which use different frequency components.

25. The wireless transmitting device according to claim 22, wherein the signal generator is configured to generate the signal for transmitting the wireless packet that includes the signal field, which comprises:
- a first signal field conforming to IEEE 802.11a; and
- a second signal field indicating that the AGC preamble and the second long-preamble conform to a standard other than IEEE 802.11a.

26. The wireless transmitting device according to claim 22, wherein the signal generator is configured to generate the signal for transmitting the wireless packet that includes the second long-preamble, which is transmitted by the plurality of antennas in parallel and is orthogonalized with respect to another second long-preamble by using Walsh sequences.

27. The wireless transmitting device according to claim 16, wherein
the first communication system conforms to IEEE802.11a, and
the second communication system conforms to IEEE802.11n.

28. The wireless transmitting device according to claim 27, wherein
the signal generator is configured to generate the signal for transmitting the wireless packet that includes the AGC preamble, which is formed by cyclic shifting of temporal positions, and
an amount of cyclic shift is different for different ones of the antennas.

29. The wireless transmitting device according to claim 27, wherein the signal generator is configured to generate the signal for transmitting the wireless packet that includes the AGC preamble that is transmitted in parallel via the plurality of antennas, which use different frequency components.

30. The wireless transmitting device according to claim 27, wherein the signal generator is configured to generate the signal for transmitting the wireless packet that includes the signal field, which comprises:
- a first signal field conforming to IEEE 802.11a; and
- a second signal field indicating that the AGC preamble and the second long-preamble conform to a standard other than IEEE 802.11a.

31. The wireless transmitting device according to claim 27, wherein the signal generator is configured to generate the signal for transmitting the wireless packet that includes the second long-preamble, which is transmitted by the plurality of antennas in parallel and is orthogonalized with respect to another second long-preamble by using Walsh sequences.

32. The wireless transmitting device according to claim 16, wherein
the signal generator is configured to generate the signal for transmitting the wireless packet that includes the AGC preamble, which is formed by cyclic shifting of temporal positions, and
an amount of cyclic shift is different for different ones of the antennas.

33. The wireless transmitting device according to claim 16, wherein the signal generator is configured to generate the signal for transmitting the wireless packet that includes the AGC preamble that is transmitted in parallel via the plurality of antennas, which use different frequency components.

34. The wireless transmitting device according to claim 16, wherein the signal generator is configured to generate the signal for transmitting the wireless packet that includes the signal field, which comprises:
- a first signal field conforming to IEEE 802.11a; and
- a second signal field indicating that the AGC preamble and the second long-preamble conform to a standard other than IEEE 802.11a.

35. The wireless transmitting device according to claim 16, wherein the signal generator is configured to generate the signal for transmitting the wireless packet that includes the second long-preamble, which is transmitted by the plurality of antennas in parallel and is orthogonalized with respect to another second long-preamble by using Walsh sequences.

36. A wireless transmitting device for communicating with a wireless receiving device by using a wireless packet, the wireless transmitting device comprising:
a signal generator configured to generate a signal for transmitting the wireless packet, the wireless packet including:
- a short-preamble used for a first automatic gain control (1st AGC) at the wireless receiving device,
- a first long-preamble for estimating a channel impulse response between the wireless transmitting device and the wireless receiving device,
- a signal field following the short-preamble and the first long-preamble, and for conveying information regarding a length of the wireless packet,
- an AGC preamble following the signal field, and used for a second automatic gain control (2nd AGC) performed after the first automatic gain control at the wireless receiving device,
- a second long-preamble for estimating the channel impulse response between the wireless transmitting device and the wireless receiving device, and
- a data field conveying data;
wherein the AGC preamble and the data field are transmitted in parallel via a plurality of antennas, the AGC preamble is formed by cyclic shifting of temporal positions, an amount of cyclic shift is different for different ones of the antennas, the short-preamble, the first long-preamble, and the signal field are transmitted via at least one of the antennas;

the short-preamble, the first long-preamble, and the signal field are recognizable by both a first communication system and a second communication system; and the AGC preamble and the data field are recognizable by the second communication system.

37. A wireless transmitting method for using a wireless transmitting device for communicating with a wireless receiving device by using a wireless packet, the method comprising:

generating a signal for transmitting the wireless packet, the wireless packet including:

a short-preamble used for a first automatic gain control (AGC) at the wireless receiving device, a first long-preamble for estimating a channel impulse response between the wireless transmitting device and the wireless receiving device, a signal field following the short-preamble and the first long-preamble, and for conveying information regarding a length of the wireless packet, an AGC preamble following the signal field, and used for a second automatic gain control (AGC) performed after the first automatic gain control at the wireless receiving device, a second long-preamble for estimating the channel impulse response between the wireless transmitting device and the wireless receiving device, and a data field conveying data; and transmitting the AGC preamble in parallel via a plurality of antennas.

38. A wireless transmitting method for using a wireless transmitting device for communicating with a wireless receiving device by using a wireless packet, the method comprising:

generating a signal for transmitting the wireless packet, the wireless packet including:

a short-preamble used for a first automatic gain control (AGC) at the wireless receiving device, a first long-preamble for estimating a channel impulse response between the wireless transmitting device and the wireless receiving device, a signal field following the short-preamble and the first long-preamble, and for conveying information regarding a length of the wireless packet, an AGC preamble following the signal field, and used for a second automatic gain control (AGC) performed after the first automatic gain control at the wireless receiving device, a second long-preamble for estimating the channel impulse response between the wireless transmitting device and the wireless receiving device, and a data field conveying data; and transmitting the AGC preamble and the data field in parallel via a plurality of antennas.

39. A wireless transmitting method for using a wireless transmitting device for communicating with a wireless receiving device by using a wireless packet, the method comprising:

generating a signal for transmitting the wireless packet, the wireless packet including:

a short-preamble used for a first automatic gain control (AGC) at the wireless receiving device, a first long-preamble for an estimating a channel impulse response between the wireless transmitting device and the wireless receiving device, a signal field following the short-preamble and the first long-preamble, and for conveying information regarding a length of the wireless packet, an AGC preamble following the signal field, and used for a second automatic gain control (AGC) performed after the first automatic gain control at the wireless receiving device, a second long-preamble for estimating the channel impulse response between the wireless transmitting device and the wireless receiving device, and a data field conveying data;

transmitting the AGC preamble and the data field in parallel via a plurality of antennas; and the short-preamble, the first long-preamble, and the signal field are transmitted via at least one of the antennas.

40. A wireless transmitting method for using a wireless transmitting device for communicating with a wireless receiving device by using a wireless packet, the method comprising:

generating a signal for transmitting the wireless packet, the wireless packet including:

a short-preamble used for a first automatic gain control (AGC) at the wireless receiving device, a first long-preamble for estimating a channel impulse response between the wireless transmitting device and the wireless receiving device, a signal field following the short-preamble and the first long-preamble, and for conveying information regarding a length of the wireless packet, an AGC preamble following the signal field, and used for a second automatic gain control (AGC) performed after the first automatic gain control at the wireless receiving device, a second long-preamble for estimating the channel impulse response between the wireless transmitting device and the wireless receiving device, and a data field conveying data;

transmitting the AGC preamble and the data field in parallel via a plurality of antennas; and transmitting the short-preamble, the first long-preamble, and the signal field via at least one of the antennas, wherein the short-preamble, the first long-preamble, and the signal field are recognizable by both a first communication system and a second communication system, and the AGC preamble and the data field are recognizable by the second communication system.

41. A wireless transmitting method for using a wireless transmitting device for communicating with a wireless receiving device by using a wireless packet, the method comprising:

generating a signal for transmitting the wireless packet, the wireless packet including:

a short-preamble used for a first automatic gain control (AGC) at the wireless receiving device, a first long-preamble for estimating a channel impulse response between the wireless transmitting device and the wireless receiving device, a signal field following the short-preamble and the first long-preamble, and for conveying information regarding a length of the wireless packet, an AGC preamble following the signal field, and used for a second automatic gain control (AGC) performed after the first automatic gain control at the wireless receiving device, a second long-preamble for estimating the channel impulse response between the wireless transmitting device and the wireless receiving device, and a data field conveying data;

transmitting the AGC preamble and the data field in parallel via a plurality of antennas;

transmitting the short-preamble, the first long-preamble, and the signal field via at least one of the antennas, wherein the AGC preamble is formed by cyclic shifting of temporal positions, an amount of cyclic shift is different for different ones of the antennas, the short-preamble, the first long-preamble, and the signal field are recognizable by both a first communication system and a second communication system, and the AGC preamble and the data field are recognizable by the second communication system.

* * * * *